(12) United States Patent
DeMarco

(10) Patent No.: US 8,862,925 B2
(45) Date of Patent: Oct. 14, 2014

(54) PSEUDO SYNCHRONOUS SERIAL INTERFACE SYNCHRONIZATION METHOD

(75) Inventor: Joseph T. DeMarco, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 234 days.

(21) Appl. No.: 13/285,131

(22) Filed: Oct. 31, 2011

(65) Prior Publication Data

US 2012/0198264 A1    Aug. 2, 2012

Related U.S. Application Data

(60) Provisional application No. 61/437,213, filed on Jan. 28, 2011.

(51) Int. Cl.
| | |
|---|---|
| G06F 1/12 | (2006.01) |
| H04L 7/033 | (2006.01) |
| G06F 1/10 | (2006.01) |
| H04L 7/00 | (2006.01) |
| H03K 5/135 | (2006.01) |

(52) U.S. Cl.
CPC ................. *G06F 1/10* (2013.01); *H04L 7/0041* (2013.01); *H04L 7/0337* (2013.01); *H03K 5/135* (2013.01)
USPC .......................................... 713/401; 370/502

(58) Field of Classification Search
USPC .................. 713/300–440, 500–600; 370/503
See application file for complete search history.

(56) References Cited

U.S. PATENT DOCUMENTS

| | | | |
|---|---|---|---|
| 6,061,822 A |  5/2000 | Meyer | |
| 2002/0114356 A1* | 8/2002 | Morita et al. | 370/503 |
| 2004/0187046 A1* | 9/2004 | Lee et al. | 713/500 |
| 2004/0202270 A1* | 10/2004 | Lentine et al. | 375/376 |
| 2006/0279348 A1 | 12/2006 | Woo et al. | |

OTHER PUBLICATIONS

"International Application Serial No. PCT/US2011/058555, International Search Report mailed Mar. 14, 2012", 2 pgs.
"International Application Serial No. PCT/US2011/058555, Written Opinion mailed Mar. 14, 2012" 6 pgs.

* cited by examiner

*Primary Examiner* — Faisal M Zaman
*Assistant Examiner* — Kim Huynh
(74) *Attorney, Agent, or Firm* — Schwegman Lundberg & Woessner, P.A.

(57) ABSTRACT

Primary serial interface logic is synchronized by cycling through a plurality of delays upon power up of the serial interface until a synchronization bit pattern is located. A minimum delay and a maximum delay are determined for the primary serial interface logic, and a delay is set to a midpoint between the minimum delay and the maximum delay. Secondary serial interface logic is synchronized by cycling through a plurality of delays until the output of the secondary serial interface logic equals the output of the primary serial interface logic. A minimum delay and a maximum delay are determined for the secondary serial interface logic, and a delay is set to a midpoint between the minimum delay and the maximum delay.

31 Claims, 8 Drawing Sheets

PSEUDO SYNCHRONOUS SERIAL INTERFACE SYNCHRONIZATION METHOD

CLAIM OF PRIORITY

This patent application claims the benefit of priority, under 35 U.S.C. §119(e), to U.S. Provisional Patent Application Ser. No. 61/437,213, entitled PSUEDO SYNCHRONOUS SERIAL INTERFACE SYNCHRONIZATION METHOD, which was filed on Jan. 28, 2011, and which is hereby incorporated by reference herein in its entirety.

TECHNICAL FIELD

The present disclosure relates to synchronization circuits and synchronization methods for serial interfaces.

BACKGROUND

Synchronous high speed serial interfaces typically require the clock and data to be sent from the transmitting device to the receiving device as phase aligned paired data. If the clock and data are not paired together the resulting phase relationship is difficult to predict and can vary over temperature. The problem is greatly exacerbated if the clock and data paths each use either a different number of buffers, buffer component types, or system routing topology. To overcome the data/clock skew over temperature, high data rate serial interfaces must be resynchronized periodically over temperature in order to compensate for the changing skew. Unfortunately, during this resynchronization, the data is interrupted by a synchronization pattern. Alternatively, the interface could be treated asynchronously and a device with clock recovery circuitry could be implemented. However, such a set up increases both the cost and the complexity of the interface.

DETAILED DESCRIPTION

Figure 1:
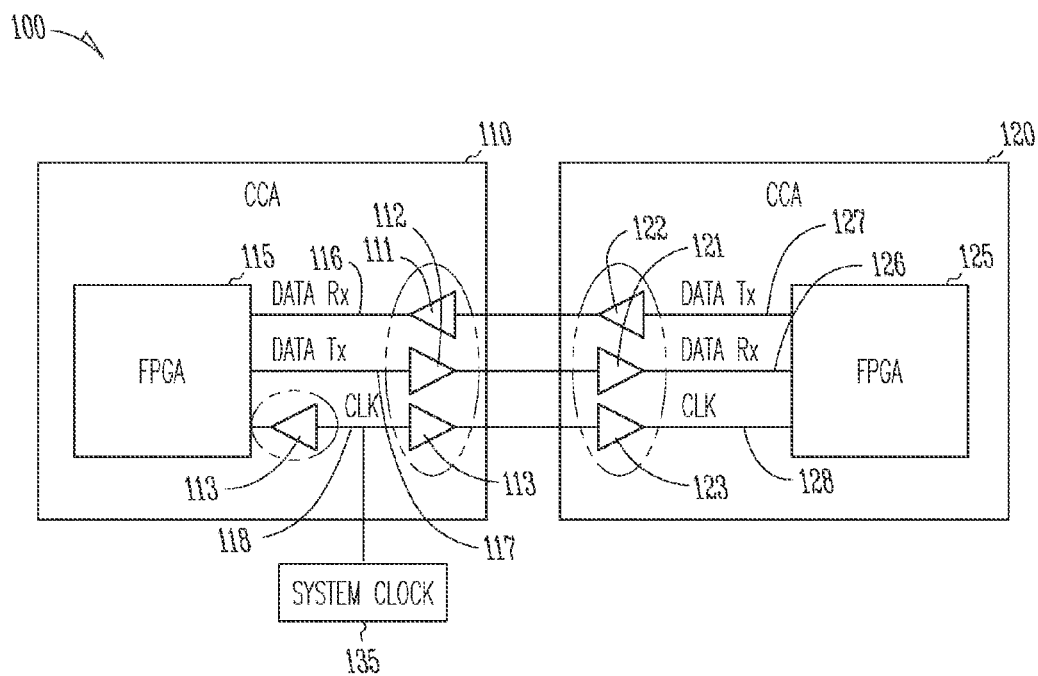
FIG. 1 is a block diagram of a serial interface in accordance with some embodiments.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the scope of the invention. In addition, it is to be understood that the location or arrangement of individual elements within each disclosed embodiment may be modified without departing from the scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 is a block diagram of a full duplex serial interface in accordance with some embodiments. Circuit card assembly (CCA) 110 includes a field programmable gate array (FPGA) 115, data receive line 116, data transmit line 117, and a clock line 118. A system clock 135 is coupled to the clock line 118. CCA 110 further includes a data receive buffer 111, a data transmit buffer 112, and clock buffers 113. CCA 120 includes a field programmable gate array (FPGA) 125, a data receive line 126, a data transmit line 127, and clock line 128. CCA 120 further includes a data receive buffer 121, a data transmit buffer 122, and a clock buffer 123. In a typical serial interface, the synchronization of the clock 135 and the data transmitted over lines 116, 117, 126, and 127 is affected differently over temperature because the temperature variation affects each buffer (111, 112, 113, 121, 122) differently. Also, the use of two buffers 113, 123 in the system clock path to FPGA 125, versus the use of one buffer 113 to FPGA 115, creates additional timing differences over temperature, since the system clock 135 determines the timing of data transmitted out of FPGA 115, 125 and outputs 117, 127.

Figure 2:
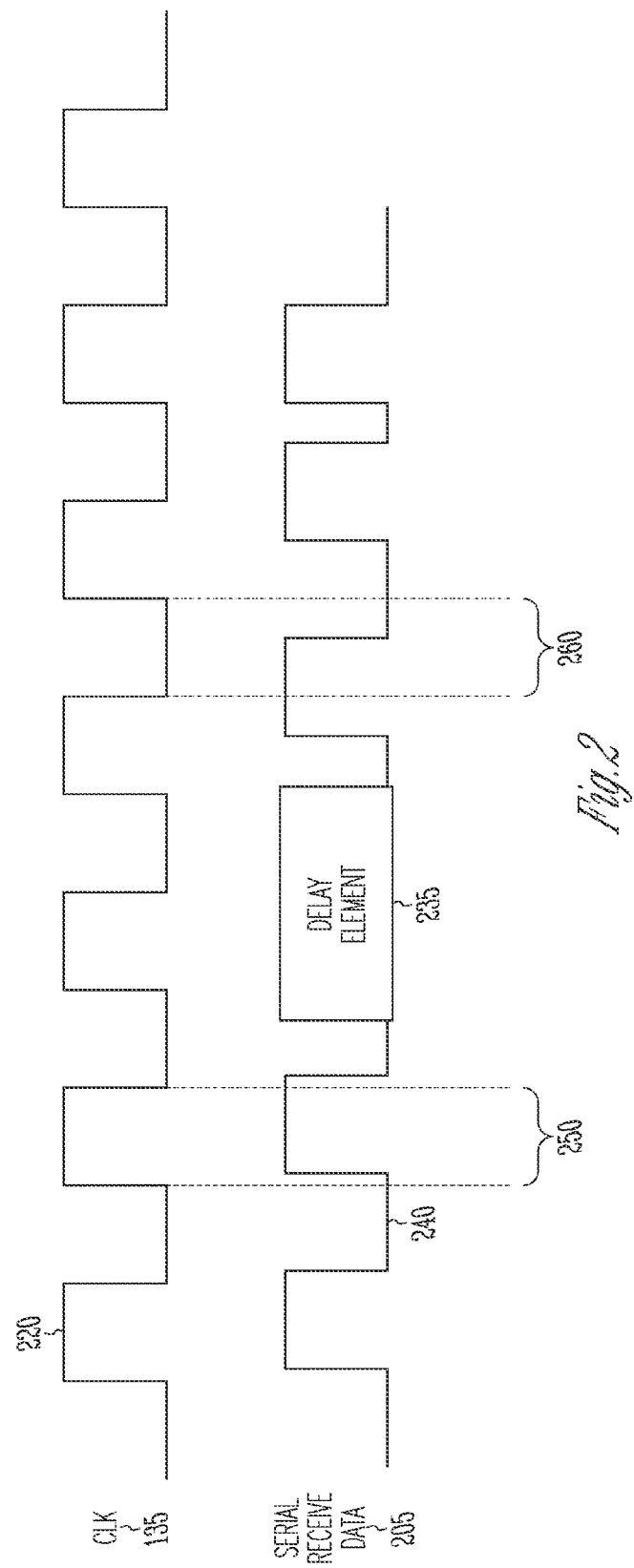
FIG. 2 illustrates a use of a delay element to synchronize a clock with data in accordance with some embodiments.

FIG. 2 illustrates the skewing of the clock 135 and data from a data receive line 205, and the use of a delay element 235 to resynchronize the clock and the data. In this illustration, data receive line 205 is sampled on both rising and falling clock transitions in double data rate (DDR) fashion. The optimal clock and data timing relationship is for the clock transitions to occur between two data transitions, with a phase alignment of 90 degrees. Specifically, FIG. 2 illustrates the skewing of clock wave 220 and data wave 240 at 250, wherein the data begins to trail the clock. As noted, this skewing can result from the fact that buffer propagation times between the clock and data change over temperature, which in turn changes the clock/data phase relationship. The delay element 235 cycles through delays until the clock and the data are resynchronized. At 260, the clock and data have been synchronized. A periodic resynchronization of the interface keeps the phasing acceptable inside of the FPGAs 115, 125.

Figure 3:
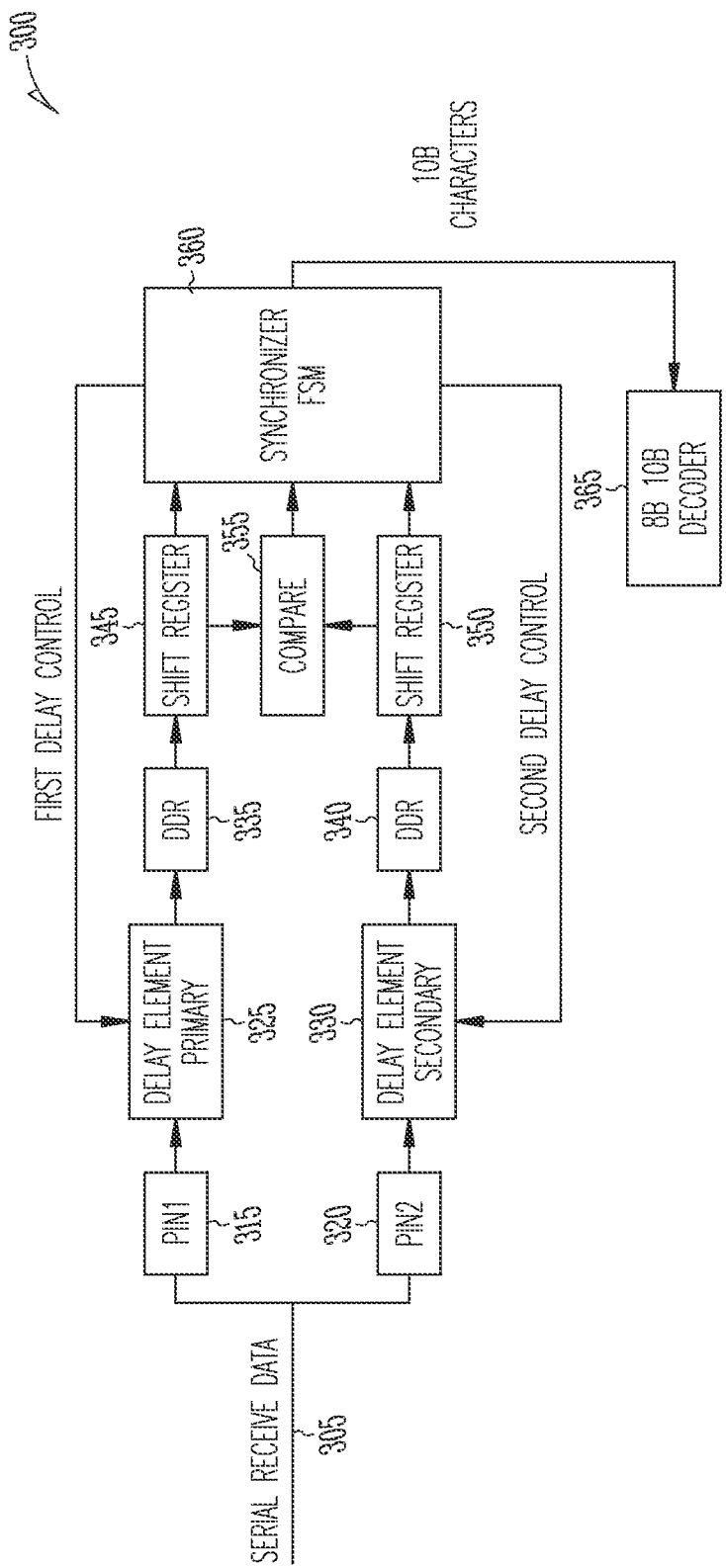
FIG. 3 is a block diagram of an example embodiment of a circuit to synchronize a serial interface in accordance with some embodiments.

FIG. 3 is a block diagram of an example embodiment of a circuit 300 to resynchronize a serial interface. In circuit 300, serial data 305 enters the circuit 300 via a first pin 315 and a second pin 320. The circuit 300 includes a first delay control that includes a primary delay element 325, a sampling unit 335, a shift register 345, and a synchronizer 360. The sampling unit 335 can be a single or double data rate (SDR/DDR) register. Similarly, a second delay control includes a secondary delay element 330, a sampling unit 340, a shift register 350, and the synchronizer 360. A comparator 355 is coupled to the shift registers 345, 350. Shift registers 345, 350 output parallel data with a bit width greater than the data character size to allow the data synchronizer 360 and comparator 355 access to multiple bit boundaries. Output from the synchronizer 360 can be coupled to an 8B10B decoder or other decoder.

Figure 4:
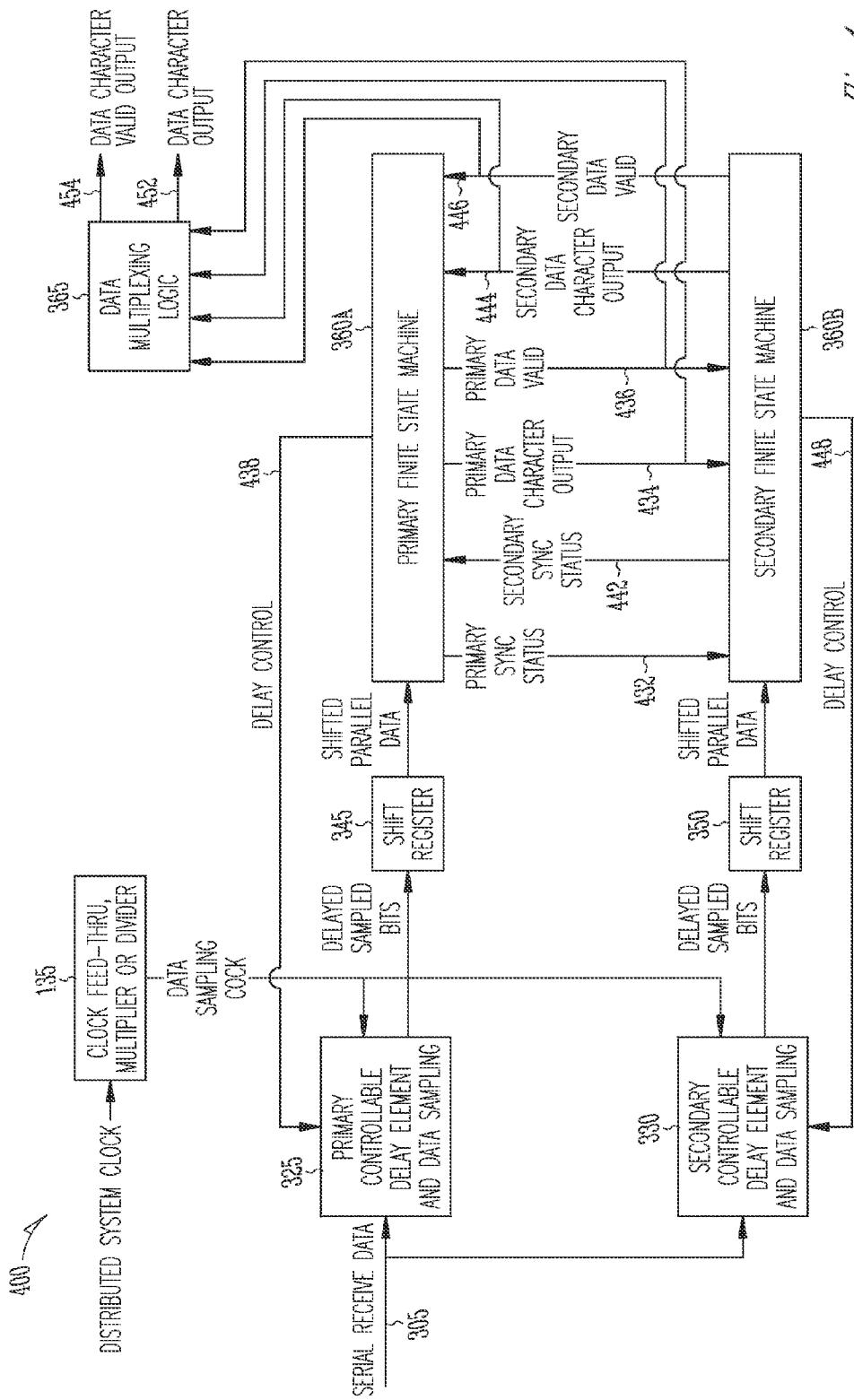
FIG. 4 is a block diagram of another example embodiment of a circuit to synchronize a serial interface in accordance with some embodiments.
Figure 5A:
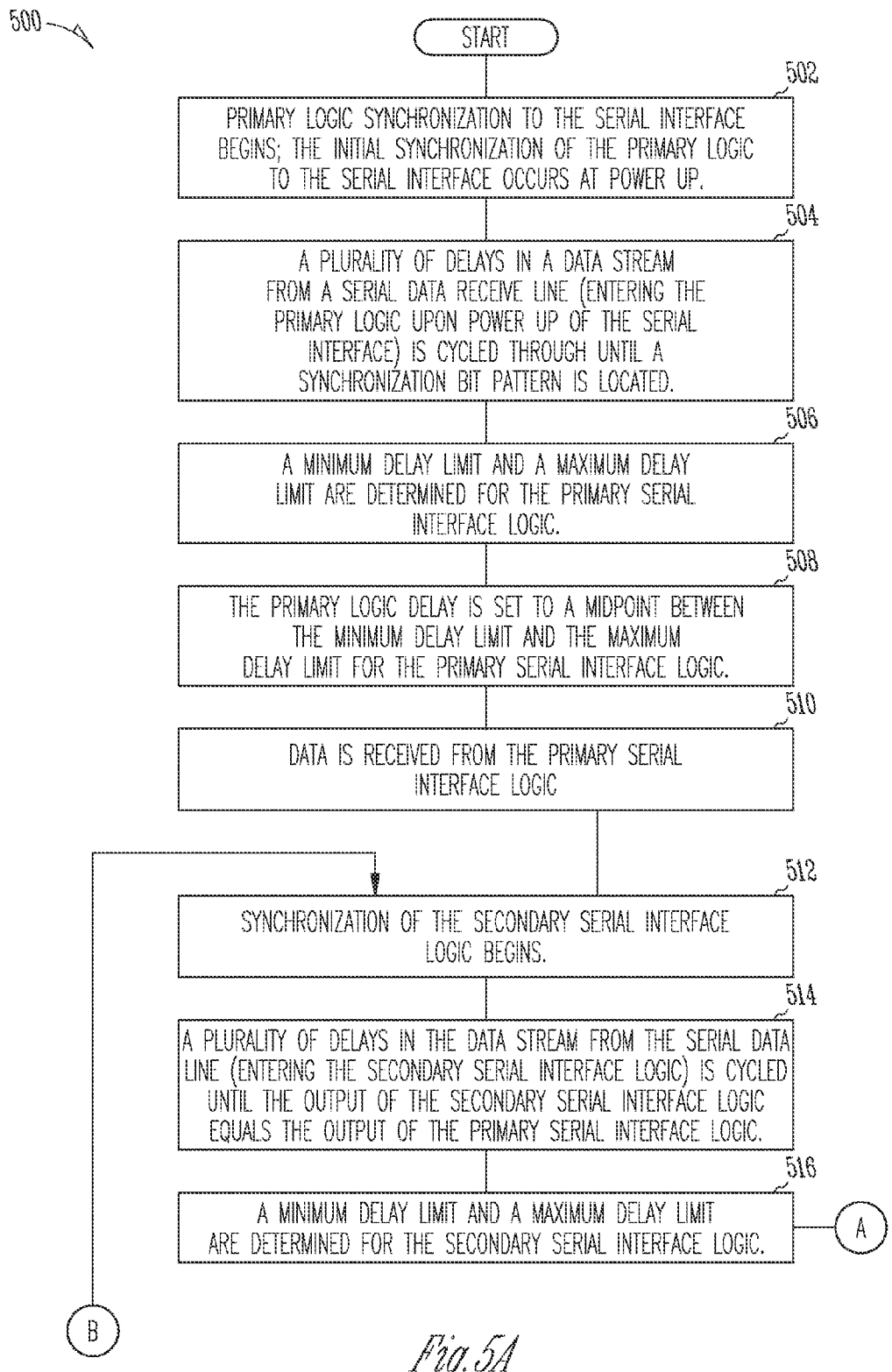
FIGS. 5A, 5B, 5C and 5D are a flowchart of an example embodiment of a process to resynchronize a serial interface in accordance with some embodiments.
Figure 5B:
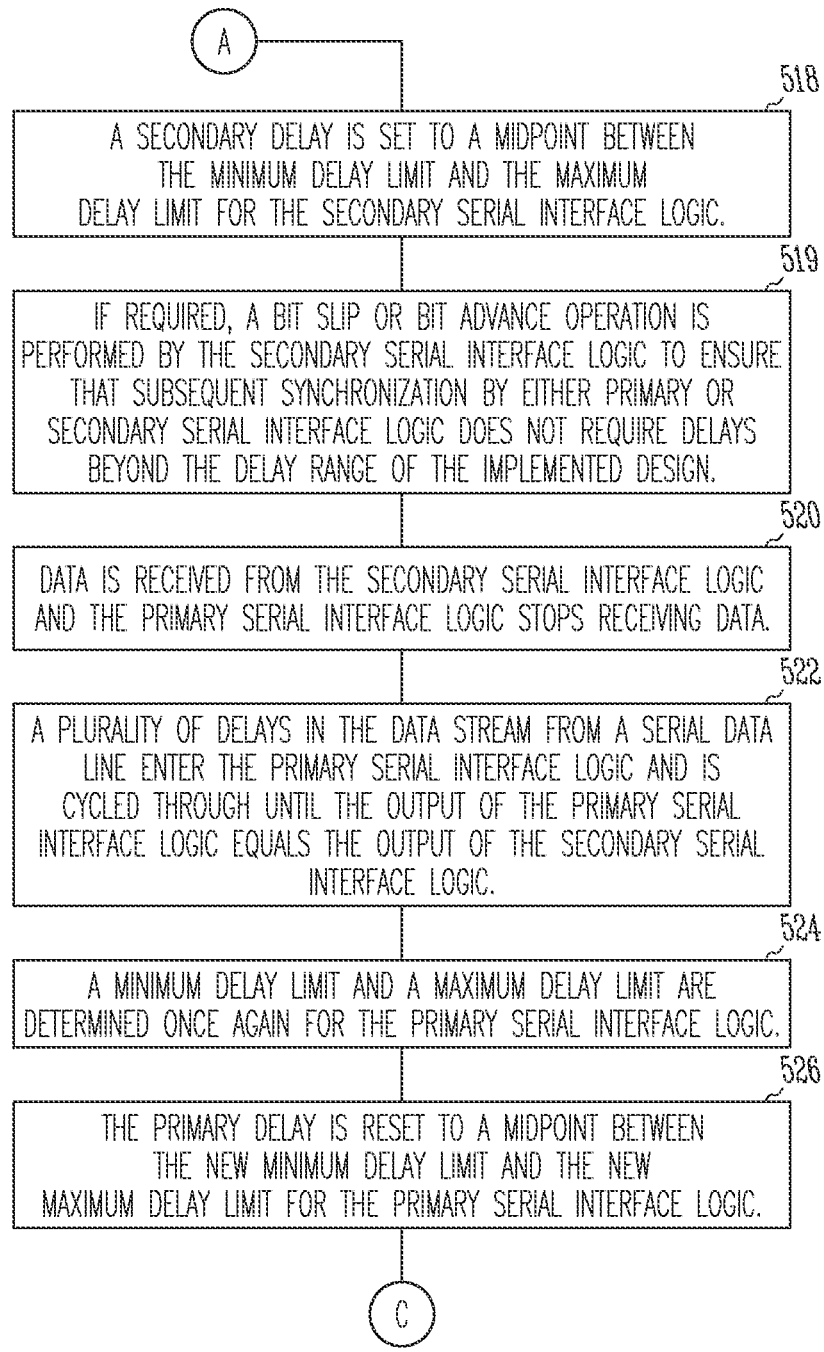
Figure 5C:
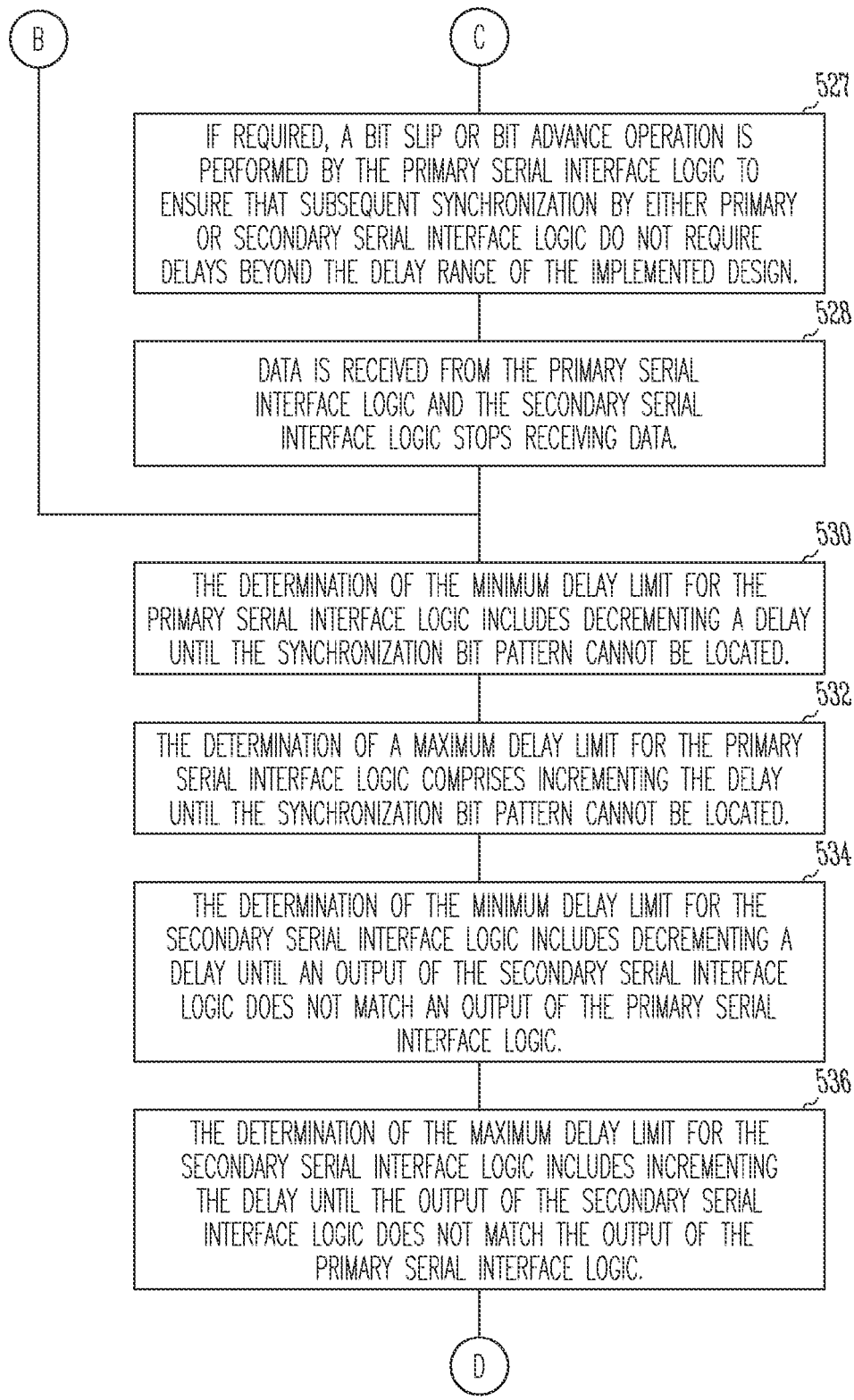
Figure 5D:
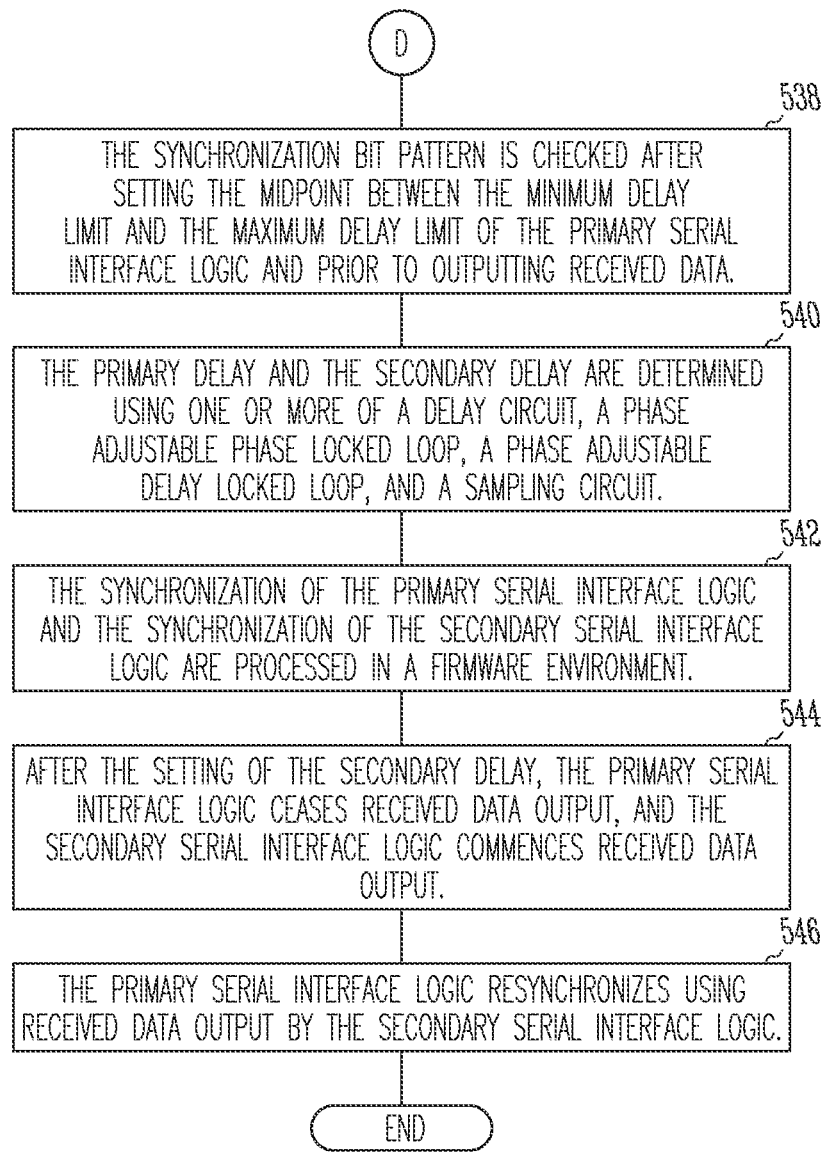

FIG. 4 is a block diagram of another example embodiment of a circuit 400 to resynchronize a serial interface. The circuit 400 includes a system clock 135, which is coupled to and provides input to a primary delay element and data sampler 325 and a secondary delay element and data sampler 330. The primary and secondary elements receive serial data 305 as input. As noted on FIG. 4, the clock can be a distributed system clock, with a frequency synchronized to the data frequency, but with a variable phase relationship, or with a frequency within an acceptable deviation from the data frequency. Specifically, the clock and the serial data should be phase aligned so that the data is sampled in the center of a bit period. The output of the primary element 325 is coupled to a shift register 345, and the output of secondary element 330 is coupled to a shift register 350. The output of shift register 345 is coupled to a primary finite state machine 360A, and the output of shift register 350 is coupled to a secondary state machine 360B. Shift registers 345, 350 output parallel data with a bit width greater than the data character size to allow finite state machines 360A, 360B access to multiple bit boundaries. The primary and secondary state machines update the synchronization status to each other via primary synchronization line 432 and secondary synchronization line 442 respectively. Primary finite state machine 360A includes primary data output 434 and primary data validation 436, both of which are coupled to the secondary finite state machine 360B and multiplexer 365. Similarly, secondary finite state machine 360B includes secondary data output 444 and secondary data validation 446, both of which are coupled to the primary finite state machine 360A and the multiplexer 365. The multiplexer includes a data character output 452 and a data validation 454. The primary finite state machine 360A includes a delay control line 438 coupled to primary element 325, and the secondary finite state machine 360B includes a delay control line 448 coupled to the secondary element 330.

FIGS. 5A-5D are a flowchart of an example process 500 for synchronizing a serial interface. FIGS. 5A-5D include a number of process blocks 502-546. Though arranged primarily serially in the example of FIGS. 5A-5D, other examples may reorder the blocks, omit one or more blocks, and/or execute two or more blocks in parallel using multiple processors or a single processor organized as two or more virtual machines or sub-processors. Moreover, still other examples can implement the blocks as one or more specific interconnected hardware or integrated circuit modules with related control and data signals communicated between and through the modules. Thus, any process flow is applicable to software, firmware, hardware, and hybrid implementations.

Referring to FIGS. 5A-5D, at 502, the primary logic synchronization to the serial interface begins. The initial synchronization of the primary logic to the serial interface occurs at power up. At 504, a plurality of delays in a data stream from a serial data receive line (entering the primary logic upon power up of the serial interface) is cycled through until a synchronization bit pattern is located. At 506, a minimum delay limit and a maximum delay limit are determined for the primary serial interface logic. At 508, the primary logic delay is set to a midpoint between the minimum delay limit and the maximum delay limit for the primary serial interface logic. At 510, data is received from the primary serial interface logic.

At 512, the secondary serial interface logic is synchronized. At 514, a plurality of delays in the data stream from the serial data line (entering the secondary serial interface logic) is cycled until the output of the secondary serial interface logic equals the output of the primary serial interface logic. At 516, a minimum delay limit and a maximum delay limit are determined for the secondary serial interface logic. At 518, the secondary delay is set to a midpoint between the minimum delay limit and the maximum delay limit for the secondary serial interface logic. At 519, a bit slip or bit advance operation, if required, is performed by the secondary serial interface logic to ensure that subsequent synchronization by either primary or secondary serial interface logic does not require delays beyond the delay range of the implemented design. At 520, data is received from the secondary serial interface logic and the primary serial interface logic stops receiving data.

At 522, a plurality of delays in the data stream from the serial data line enters the primary serial interface logic and is cycled through until the output of the primary serial interface logic equals the output of the secondary serial interface logic. At 524, a minimum delay limit and a maximum delay limit are determined once again for the primary serial interface logic. At 526, the primary delay is reset to a midpoint between the new minimum delay limit and the new maximum delay limit for the primary serial interface logic. At 527, a bit slip or bit advance operation, if required, is performed by the primary serial interface logic to ensure that subsequent synchronization by either primary or secondary serial interface logic does not require delays beyond the delay range of the implemented design. At 528, data is received from the primary serial interface logic and the secondary interface stops receiving data.

After the initial completion of steps 502-528, the circuit then alternates resynchronization between the primary serial interface logic (522-528) and the secondary serial interface logic (512-520).

Continuing with the process 500 of FIGS. 5A-5D, at 530, the determination of the minimum delay limit for the primary serial interface logic includes decrementing a delay until the synchronization bit pattern cannot be located. At 532, the determination of a maximum delay limit for the primary serial interface logic comprises incrementing the delay until the synchronization bit pattern cannot be located. At 534, the determination of the minimum delay limit for the secondary serial interface logic includes decrementing a delay until an output of the secondary serial interface logic does not match an output of the primary serial interface logic. At 536, the determination of the maximum delay limit for the secondary serial interface logic includes incrementing the delay until the output of the secondary serial interface logic does not match the output of the primary serial interface logic.

At 538, the synchronization bit pattern is checked after setting the midpoint between the minimum delay limit and the maximum delay limit of the primary serial interface logic and prior to outputting received data. At 540, the primary delay and the secondary delay are determined using one or more of a delay circuit, a phase adjustable phase locked loop, a phase adjustable delay locked loop, and a sampling circuit. At 542, the synchronization of the primary serial interface logic and the synchronization of the secondary serial interface logic are processed in a firmware environment. At 544, after the setting of the secondary delay, the primary serial interface logic ceases received data output, and the secondary serial interface logic commences received data output. At 546, the primary serial interface logic resynchronizes using the received data output by the secondary serial interface logic.

EXAMPLE EMBODIMENTS

Example No. 1 is a synchronization circuit including primary serial interface logic configured for coupling to a serial data receive line; a primary delay element coupled to the primary serial interface logic; a secondary serial interface logic configured for coupling to the serial data receive line; a secondary delay element coupled to the secondary serial interface logic; a primary sampling means and a primary shift register coupled to the primary serial interface logic, and a secondary sampling means and a secondary shift register coupled to the secondary serial interface logic; and a synchronizer coupled to the primary shift register and the secondary shift register.

Example No. 2 includes the features of Example No. 1, and optionally includes a circuit wherein the synchronizer comprises one or more finite state machines coupled together.

Example No. 3 includes the features of Example Nos. 1-2, and optionally includes a circuit wherein the circuit is configured to synchronize the primary serial interface logic and the secondary serial interface logic utilizing 8b10b character encoding or similar coding scheme to achieve DC line balance, wherein encoded characters are continuously transmitted.

Example No. 4 includes the features of Example Nos. 1-3, and optionally includes a circuit wherein the primary sampling means and the secondary sampling means comprise a single data rate register or a double data rate register.

Example No. 5 includes the features of Example Nos. 1-4, and optionally includes a circuit wherein one or more of the primary delay element and the secondary delay element comprise one or more of a delay circuit, a phase adjustable phase locked loop, a phase adjustable delay locked loop, and a sampling circuit.

Example No. 6 includes the features of Example Nos. 1-5, and optionally includes a comparator coupled to the primary shift register and the secondary shift register.

Example No. 7 includes the features of Example Nos. 1-6, and optionally includes a circuit wherein one or more of the primary serial interface logic, the primary delay means, the primary sampling means and the primary shift register are configured for synchronizing the primary serial interface logic by cycling through a plurality of delays in a data stream from the serial data receive line until a synchronization bit pattern is located; determining a minimum delay limit and a maximum delay limit for the primary serial interface logic using the bit synchronization pattern; setting a primary delay to a midpoint between the minimum delay limit and the maximum delay limit for the primary serial interface logic; and outputting received data via the primary serial interface logic as a function of the primary delay; and wherein one or more of the secondary serial interface logic, the secondary delay means, the secondary sampling means, and the secondary shift register are configured for synchronizing the secondary serial interface logic by cycling through a plurality of delays in the data stream from the serial data receive line until the received data output of the secondary serial interface logic equals the received data output of the primary serial interface logic; determining a minimum delay limit and a maximum delay limit for the secondary serial interface logic by matching the received data output of the primary serial interface logic and the received data output of the secondary serial interface logic; setting a secondary delay to a midpoint between the minimum delay limit and the maximum delay limit for the secondary serial interface logic; performing a bit slip or bit advance process to prevent subsequent resynchronizations from requiring delays beyond what is possible of an implemented design; and outputting received data via the secondary serial interface logic as a function of the secondary delay logic.

Example No. 8 includes the features of Example Nos. 1-7, and optionally includes a circuit wherein the circuit is configured for repeating in an alternating manner the synchronizing of the primary serial interface logic and the synchronizing of the secondary serial interface logic.

Example No. 9 includes the features of Example Nos. 1-8, and optionally includes a circuit wherein the determining a minimum delay limit for the primary serial interface logic comprises decrementing a delay until the synchronization bit pattern cannot be located; and the determining a maximum delay limit for the primary serial interface logic comprises incrementing the delay until the synchronization bit pattern cannot be located.

Example No. 10 includes the features of Example Nos. 1-9, and optionally includes a circuit wherein the circuit is configured for checking for the synchronization bit pattern after setting the midpoint between the minimum delay limit and the maximum delay limit of the primary serial interface logic and prior to outputting received data.

Example No. 11 includes the features of Example Nos. 1-10, and optionally includes a circuit wherein the determining a minimum delay limit for the secondary serial interface logic comprises decrementing a delay until an output of the secondary serial interface logic does not match an output of the primary serial interface logic; and the determining a maximum delay limit for the secondary serial interface logic comprises incrementing the delay until the received data output of the secondary serial interface logic does not match the received data output of the primary serial interface logic.

Example No. 12 includes the features of Example Nos. 1-11, and optionally includes a circuit wherein the synchronizing the primary serial interface logic and the synchronizing the secondary serial interface logic are processed in a firmware environment.

Example No. 13 includes the features of Example Nos. 1-12, and optionally includes a circuit wherein after the setting of the secondary delay, the primary serial interface logic ceases received data output, and the secondary serial interface logic commences received data output.

Example No. 14 includes the features of Example Nos. 1-13, and optionally includes a circuit wherein the primary serial interface logic resynchronizes using the received data output by the secondary serial interface logic.

Example No. 15 includes the features of Example Nos. 1-14, and optionally includes a circuit wherein the cycling through a plurality of delays in a data stream from a serial data line until a synchronization bit pattern is located uses the data stream entering the primary serial interface logic upon power up of the serial interface.

Example No. 16 is a computer readable medium comprising instructions that when executed by a processor execute a process comprising synchronizing primary serial interface logic by cycling through a plurality of delays in a data stream from a serial data receive line until a synchronization bit pattern is located; determining a minimum delay limit and a maximum delay limit for the primary serial interface logic using the bit synchronization pattern; setting a primary delay to a midpoint between the minimum delay limit and the maximum delay limit for the primary serial interface; and outputting received data via the primary serial interface as a function of the primary delay; and synchronizing secondary serial interface logic by cycling through a plurality of delays in the data stream from the serial data line until the received data output of the secondary serial interface logic equals the received data output of the primary serial interface logic; determining a minimum delay limit and a maximum delay limit for the secondary serial interface logic by matching the received data output of the primary serial interface logic and the received data output of the secondary serial interface logic; setting a secondary delay to a midpoint between the minimum delay limit and the maximum delay limit for the secondary serial interface logic; performing a bit slip or bit advance process to prevent subsequent resynchronizations from requiring delays beyond what is possible of an implemented design; and outputting received data via the secondary interface logic as a function of the secondary delay.

Example No. 17 includes the features of Example No. 16, and optionally includes instructions for repeating in an alternating manner the synchronizing of the primary serial interface logic and the synchronizing of the secondary serial interface logic.

Example No. 18 includes the features of Example Nos. 16-17, and optionally includes a computer readable medium wherein the determining a minimum delay limit for the primary serial interface logic comprises decrementing a delay until the synchronization bit pattern cannot be located; and the determining a maximum delay limit for the primary serial interface logic comprises incrementing the delay until the synchronization bit pattern cannot be located.

Example No. 19 includes the features of Example Nos. 16-18, and optionally includes instructions for checking for the synchronization bit pattern after setting the midpoint between the minimum delay limit and the maximum delay limit of the primary serial interface logic and prior to outputting received data.

Example No. 20 includes the features of Example Nos. 16-19, and optionally includes a computer readable medium wherein the determining a minimum delay limit for the secondary serial interface logic comprises decrementing a delay until an output of the secondary serial interface logic does not match an output of the primary serial interface logic; and the determining a maximum delay limit for the secondary serial interface logic comprises incrementing the delay until the received data output of the secondary serial interface logic does not match the received data output of the primary serial interface logic.

Example No. 21 includes the features of Example Nos. 16-20, and optionally includes a computer readable medium wherein one or more of the primary delay and the secondary delay are determined using one or more of a delay circuit, a phase adjustable phase locked loop, a phase adjustable delay locked loop, and a sampling circuit.

Example No. 22 includes the features of Example Nos. 16-21, and optionally includes a computer readable medium wherein the synchronizing the primary serial interface logic and the synchronizing the secondary serial interface logic are processed in a firmware environment.

Example No. 23 includes the features of Example Nos. 16-22, and optionally includes a computer readable medium wherein after the setting of the secondary delay, the primary serial interface logic ceases data reception, and the secondary serial interface logic commences data reception.

Example No. 24 includes the features of Example Nos. 16-23, and optionally includes a computer readable medium wherein the primary serial interface logic resynchronizes using the received data outputted by the secondary serial interface logic.

Example No. 25 includes the features of Example Nos. 16-24, and optionally includes a computer readable medium wherein the cycling through a plurality of delays in a data stream from a serial data line until a synchronization bit pattern is located uses the data stream entering the primary serial interface logic upon power up of the serial interface.

Example No. 26 is a method comprising synchronizing primary serial interface logic by cycling through a plurality of delays in a data stream from a serial data receive line until a synchronization bit pattern is located; determining a minimum delay limit and a maximum delay limit for the primary serial interface logic using the synchronization bit pattern; setting a primary delay to a midpoint between the minimum delay limit and the maximum delay limit for the primary serial interface logic; and outputting received data via the primary serial interface logic as a function of the primary delay; and synchronizing the secondary serial interface logic by cycling through a plurality of delays in the data stream from the serial data receive line until the output of the secondary serial interface logic equals the output of the primary serial interface logic; determining a minimum delay limit and a maximum delay limit for the secondary serial interface logic by matching the received data output of the primary serial interface logic and the received logic output of the secondary serial interface logic; setting a secondary delay to a midpoint between the minimum delay limit and the maximum delay limit for the secondary serial interface logic; performing a bit slip or a bit advance process to prevent subsequent resynchronization from requiring delays beyond that possible of an implemented design; and outputting received data via the secondary interface based on the secondary delay.

Example No. 27 includes the features of Example No. 26 and optionally includes repeating in an alternating manner the synchronizing of the primary serial interface logic and the synchronizing of the secondary serial interface logic.

Example No. 28 includes the features of Example Nos. 26-27 and optionally includes a process wherein the determining a minimum delay limit for the primary serial interface logic comprises decrementing a delay until the synchronization bit pattern cannot be located; and the determining a maximum delay limit for the primary serial interface logic comprises incrementing the delay until the synchronization bit pattern cannot be located.

Example No. 29 includes the features of Example Nos. 26-28 and optionally includes a process wherein the determining a minimum delay limit for the secondary serial interface logic comprises decrementing a delay until an output of the secondary serial interface logic does not match an output of the primary serial interface logic; and the determining a maximum delay limit for the secondary serial interface logic comprises incrementing the delay until the received data output of the secondary serial interface logic does not match the received data output of the primary serial interface logic.

Example No. 30 includes the features of Example Nos. 26-29 and optionally includes a process wherein after the setting of the secondary delay, the primary serial interface logic ceases received data output, and the secondary serial interface logic commences received data output.

Example No. 31 includes the features of Example Nos. 26-30 and optionally includes a process wherein the primary serial interface logic resynchronizes using the received data output by the secondary serial interface logic.

Example No. 32 includes the features of Example Nos. 26-31 and optionally includes a process wherein the data stream enters the primary serial interface logic and is synchronized upon power up of the serial interface.

In the foregoing detailed description of embodiments of the invention, various features are grouped together in one or more embodiments for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the detailed description of embodiments of the invention, with each claim standing on its own as a separate embodiment. It is understood that the above description is intended to be illustrative, and not restrictive. It is intended to cover all alternatives, modifications and equivalents as may be included within the scope of the invention as defined in the appended claims. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "primary," "secondary," and "tertiary," etc., are used merely as labels, and are not intended to impose numerical requirements on their objects.

Embodiments may be implemented in one or a combination of hardware, firmware and software. Embodiments may also be implemented as instructions stored on a computer-readable storage medium, which may be read and executed by at least one processor to perform the operations described herein. A computer-readable storage medium may include any non-transitory mechanism for storing information in a form readable by a machine (e.g., a computer). For example, a computer-readable storage medium may include read-only memory (ROM), random-access memory (RAM), magnetic disk storage media, optical storage media, flash-memory devices, and other storage devices and media.

The abstract is provided to comply with 37 C.F.R. 1.72(b) to allow a reader to quickly ascertain the nature and gist of the technical disclosure. The Abstract is submitted with the understanding that it will not be used to interpret or limit the scope or meaning of the claims.

The invention claimed is:

1. A synchronization circuit comprising:
   primary serial interface logic configured for coupling to a serial data receive line;
   a primary delay element coupled to the primary serial interface logic;
   secondary serial interface logic configured for coupling to the serial data receive line;
   a secondary delay element coupled to the secondary serial interface logic;
   a primary data sampler and a primary shift register coupled to the primary serial interface logic, wherein the primary data sampler is coupled to an output of the primary delay element;
   a secondary data sampler and a secondary shift register coupled to the secondary serial interface logic, wherein the secondary data sampler is coupled to an output of the secondary delay element; and
   a synchronizer coupled to the primary shift register and the secondary shift register;
   wherein one or more of the primary serial interface, the primary delay element, the primary data sampler and the primary shift register are configured for synchronizing the primary serial interface logic by:
      cycling through a plurality of delays in a data stream from the serial data receive line until a synchronization bit pattern is located;
      determining a minimum delay limit and a maximum delay limit for the primary serial interface logic using the bit synchronization pattern;
      setting a primary delay to a midpoint between the minimum delay limit and the maximum delay limit for the primary serial interface logic; and
      outputting received data via the primary serial interface as a function of the primary delay; and
   wherein one or more of the secondary serial interface logic, the secondary delay element, the secondary data sampler, and the secondary shift register are configured for synchronizing the secondary serial interface logic by:
      cycling through a plurality of delays in the data stream from the serial data receive line until the received data output of the secondary serial interface logic equals the received data output of the primary serial interface logic;
      determining a minimum delay limit and a maximum delay limit for the secondary serial interface logic by matching the received data output of the primary serial interface logic and the received data output of the secondary serial interface logic;
      setting a secondary delay to a midpoint between the minimum delay limit and the maximum delay limit for the secondary serial interface;
      performing a bit slip or bit advance process to prevent subsequent resynchronizations from requiring delays beyond what is possible of an implemented design; and
      outputting data via the secondary serial interface logic as a function of the secondary delay.

2. The synchronization circuit of claim 1, wherein the synchronizer comprises one or more finite state machines coupled together.

3. The synchronization circuit of claim 1, wherein the circuit is configured to synchronize the primary serial interface logic and the secondary serial interface logic utilizing 8b10b character encoding or similar coding scheme to achieve DC line balance, wherein encoded characters are continuously transmitted.

4. The synchronization circuit of claim 1, wherein the primary data sampler and the secondary data sampler comprise a single data rate register or a double data rate register.

5. The synchronization circuit of claim 1, wherein one or more of the primary delay element and the secondary delay element comprise one or more of a delay circuit, a phase adjustable phase locked loop, a phase adjustable delay locked loop, and a sampling circuit.

6. The synchronization circuit of claim 1, comprising comparator logic coupled to the primary shift register and the secondary shift register.

7. The synchronization circuit of claim 1, wherein the circuit is configured for repeating in an alternating manner the synchronizing of the primary serial interface logic and the synchronizing of the secondary serial interface logic.

8. The synchronization circuit of claim 1, wherein the determining a minimum delay limit for the primary serial interface logic comprises decrementing a delay until the synchronization bit pattern cannot be located; and the determining a maximum delay limit for the primary serial interface logic comprises incrementing the delay until the synchronization bit pattern cannot be located.

9. The synchronization circuit of claim 1, wherein the circuit is configured for checking for the synchronization bit pattern after setting the midpoint between the minimum delay limit and the maximum delay limit of the primary serial interface logic and prior to outputting received data.

10. The synchronization circuit of claim 1, wherein the determining a minimum delay limit for the secondary serial interface logic comprises decrementing a delay until an output of the secondary serial interface logic does not match an output of the primary serial interface logic; and the determining a maximum delay limit for the secondary serial interface logic comprises incrementing the delay until the received data output of the secondary serial interface logic does not match the received data output of the primary serial interface logic.

11. The synchronization circuit of claim 1, wherein the synchronizing the primary serial interface logic and the synchronizing the secondary serial interface logic are processed in a firmware environment.

12. The synchronization circuit of claim 1, wherein after the setting of the secondary delay, the primary serial interface logic ceases received data output, and the secondary serial interface logic commences received data output.

13. The synchronization circuit of claim 1, wherein the primary serial interface logic resynchronizes using the received data output by the secondary serial interface logic.

14. The synchronization circuit of claim 1, wherein the cycling through a plurality of delays in a data stream from a serial data line until a synchronization bit pattern is located uses the data stream entering the primary serial interface logic upon power up of the serial interface.

15. A computer readable medium comprising instructions that when executed by a processor execute a process comprising:
    synchronizing primary serial interface logic by:
        cycling through a plurality of delays in a data stream from a serial data receive line until a synchronization bit pattern is located;
        determining a minimum delay limit and a maximum delay limit for the primary serial interface logic using the bit synchronization pattern;
        setting a primary delay to a midpoint between the minimum delay limit and the maximum delay limit for the primary serial interface logic; and
        outputting received data via the primary serial interface logic as a function of the primary delay; and
    synchronizing secondary serial interface logic by:
        cycling through a plurality of delays in the data stream from the serial data line until the received data output of the secondary serial interface logic equals the received data output of the primary serial interface logic;
        determining a minimum delay limit and a maximum delay limit for the secondary serial interface logic by matching the received data output of the primary serial interface logic and the received data output of the secondary serial interface logic;
        setting a secondary delay to a midpoint between the minimum delay limit and the maximum delay limit for the secondary serial interface logic;
        performing a bit slip or bit advance process to prevent subsequent resynchronizations from requiring delays beyond what is possible of an implemented design; and
        outputting received data via the secondary serial interface logic as a function of the secondary delay.

16. The computer readable medium of claim 15, comprising instructions for repeating in an alternating manner the synchronizing of the primary serial interface logic and the synchronizing of the secondary serial interface logic.

17. The computer readable medium of claim 15, wherein the determining a minimum delay limit for the primary serial interface logic comprises decrementing a delay until the synchronization bit pattern cannot be located; and the determining a maximum delay limit for the primary serial interface logic comprises incrementing the delay until the synchronization bit pattern cannot be located.

18. The computer readable medium of claim 15, comprising instructions for checking for the synchronization bit pattern after setting the midpoint between the minimum delay limit and the maximum delay limit of the primary serial interface logic and prior to outputting received data.

19. The computer readable medium of claim 15, wherein the determining a minimum delay limit for the secondary serial interface logic comprises decrementing a delay until an output of the secondary serial interface logic does not match an output of the primary serial interface logic; and the determining a maximum delay limit for the secondary serial interface logic comprises incrementing the delay until the received data output of the secondary serial interface logic does not match the received data output of the primary serial interface logic.

20. The computer readable medium of claim 15, wherein one or more of the primary delay and the secondary delay are determined using one or more of a delay circuit, a phase adjustable phase locked loop, a phase adjustable delay locked loop, and a sampling circuit.

21. The computer readable medium of claim 15, wherein the synchronizing the primary serial interface logic and the synchronizing the secondary serial interface logic are processed in a firmware environment.

22. The computer readable medium of claim 15, wherein after the setting of the secondary delay, the primary serial interface ceases data reception and the secondary serial interface logic commences data reception.

23. The computer readable medium of claim 22, wherein the primary serial interface logic resynchronizes using the received data outputted by the secondary serial interface logic.

24. The computer readable medium of claim 15, wherein the cycling through a plurality of delays in a data stream from a serial data line until a synchronization bit pattern is located uses the data stream entering the primary serial interface logic upon power up of the serial interface.

25. A method comprising:
    synchronizing primary serial interface logic by:
        cycling through a plurality of delays in a data stream from a serial data receive line until a synchronization bit pattern is located;
        determining a minimum delay limit and a maximum delay limit for the primary serial interface logic using the synchronization bit pattern;
        setting a primary delay to a midpoint between the minimum delay limit and the maximum delay limit for the primary serial interface logic; and
        outputting data via the primary serial interface logic as a function of the primary delay; and
    synchronizing secondary serial interface logic by:
        cycling through a plurality of delays in the data stream from the serial data receive line until the received data output of the secondary serial interface logic equals the received data output of the primary serial interface logic;
        determining a minimum delay limit and a maximum delay limit for the secondary serial interface logic by matching the received data output of the primary serial interface logic and the received data output of the secondary serial interface logic;
        setting a secondary delay to a midpoint between the minimum delay limit and the maximum delay limit for the secondary serial interface logic;
        performing a bit slip or a bit advance process to prevent subsequent resynchronization from requiring delays beyond that possible of an implemented design; and
    outputting data via the secondary interface logic based on the secondary delay.

26. The method of claim 25, comprising repeating in an alternating manner the synchronizing of the primary serial interface logic and the synchronizing of the secondary serial interface logic.

27. The method of claim 25, wherein the determining a minimum delay limit for the primary serial interface logic comprises decrementing a delay until the synchronization bit pattern cannot be located; and the determining a maximum delay limit for the primary serial interface logic comprises incrementing the delay until the synchronization bit pattern cannot be located.

28. The method of claim 25, wherein the determining a minimum delay limit for the secondary serial interface logic comprises decrementing a delay until an output of the secondary serial interface logic does not match an output of the primary serial interface logic; and the determining a maximum delay limit for the secondary serial interface logic comprises incrementing the delay until the received data output of the secondary serial interface does not match the received data output of the primary serial interface logic.

29. The method of claim 25, wherein after the setting of the secondary delay, the primary serial interface logic ceases received data output, and the secondary serial interface logic commences received data output.

30. The method of claim 29, wherein the primary serial interface logic resynchronizes using the received data output by the secondary serial interface logic.

31. The method of claim 25, wherein the data stream enters the primary serial interface logic and is synchronized upon power up of the serial interface.

* * * * *